United States Patent
Kwon et al.

(10) Patent No.: US 7,512,001 B2
(45) Date of Patent: Mar. 31, 2009

(54) SEMICONDUCTOR MEMORY DEVICE, TEST SYSTEM INCLUDING THE SAME AND REPAIR METHOD OF SEMICONDUCTOR MEMORY DEVICE

(75) Inventors: Soong-Sung Kwon, Yongin-si (KR); Sang-Bum Kim, Suwon-si (KR); Sang-Wook Kang, Seoul (KR); Keon-Han Sohn, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 11/556,374

(22) Filed: Nov. 3, 2006

(65) Prior Publication Data

US 2007/0133325 A1 Jun. 14, 2007

(30) Foreign Application Priority Data

Dec. 12, 2005 (KR) .................. 10-2005-0121783

(51) Int. Cl.
*G11C 16/06* (2006.01)

(52) U.S. Cl. .................. 365/185.09; 365/200; 365/201; 365/233.1; 365/236

(58) Field of Classification Search ............ 365/185.09, 365/200, 201, 233.1, 236
See application file for complete search history.

(56) References Cited

U.S. PATENT DOCUMENTS

| 5,544,106 A | * | 8/1996 | Koike ............... 365/200 |
| 5,568,437 A |   | 10/1996 | Jamal |
| 6,108,252 A | * | 8/2000 | Park ............... 365/201 |
| 6,738,938 B2 |  | 5/2004 | Nadeau-Dostie et al. |
| 6,741,499 B2 | * | 5/2004 | Imamiya et al. ........ 365/185.17 |
| 7,116,590 B2 | * | 10/2006 | Blodgett ........... 365/200 |
| 2005/0018517 A1 |  | 1/2005 | Collura et al. |

* cited by examiner

*Primary Examiner*—Hoai V Ho
(74) *Attorney, Agent, or Firm*—F. Chau & Assoc., LLC

(57) ABSTRACT

A semiconductor memory device includes an array having memory cells arranged in rows and columns; a clock-to-address converter for counting an external clock signal to generate an address for accessing the array based on the counted value, during a test operation mode; and a redundancy circuit for storing the address generated by the clock-to-address converter.

17 Claims, 5 Drawing Sheets

SEMICONDUCTOR MEMORY DEVICE, TEST SYSTEM INCLUDING THE SAME AND REPAIR METHOD OF SEMICONDUCTOR MEMORY DEVICE

CROSS-REFERENCE TO RELATED APPLICATION

This U.S. non-provisional patent application claims priority under 35 U.S.C. § 119 from Korean Patent Application 2005-121783 filed on Dec. 12, 2005, the entire contents of which are hereby incorporated by reference.

BACKGROUND OF THE INVENTION

The present disclosure relates to a test system and, more particularly, technology for providing a repair address to a semiconductor memory device in a test operation mode.

In fabricating a semiconductor integrated circuit, various procedures including design, process, package, and test are necessary. Moreover, the test is categorized into a functional method, a parameter method, and a burn-in method. In these methods, semiconductor integrated circuits may be tested in a wafer, in die, or in a package form. Although the package is a relatively cheap procedure, semiconductor makes typically package devices before testing, that is, before determining proper operations of the semiconductor integrated circuit devices. Considering the complexity of the structures of semiconductor integrated circuit devices, however, and due to the high cost necessary for packaging semiconductor integrated circuit devices, the devices need to be tested with a wafer or die form to reduce the probability of packaging abnormal semiconductor integrated circuit devices. Further, in connection with the advent of multichip modules, a wafer or package test certainly is required since a semiconductor integrated circuit device is only one of the elements mounted on a multichip carrier.

FIG. 1 is a flowchart useful for describing a conventional test method.

Referring to FIG. 1, a test device may write test pattern data in a semiconductor integrated circuit device for example a semiconductor memory device, to be tested according to a given timing (S10). Then, the test device reads test pattern data written in the semiconductor memory device (S20). The test device judges whether the read test pattern data includes fail data (S30). The presence of fail data may be judged by comparing the read test pattern data with the written test pattern data. Defective cells of the semiconductor memory device corresponding to the fail data may be repaired with redundant cells (S40).

In order to repair defective cells of a semiconductor memory device, a conventional test device may provide addresses of the defective data to a semiconductor memory device under test via an address bus. Hereinafter, an address for defective data is referred to as a defective address or a repair address. Defective addresses from a test device may be stored in a redundancy circuit of a semiconductor memory device. The redundancy circuit includes electric fuses that are selectively cut according to the input defective addresses, which are stored in the redundancy circuit by selective cutting of electric fuses.

In general, vector address information is stored in a test device to appoint each cell of a semiconductor memory device under test. The vector address information includes addresses for appointing all cells in the semiconductor memory device under test. At a repair step, the test device may provide the semiconductor memory device under test with address information that coincides with a defective address of the vector address information. Generally, the stored space of the test device for storing vector address information is limited. As the storage capacity of a semiconductor memory device is gradually increased, its vector address information is also increased. Accordingly, it is hard to test a semiconductor memory device with increased storage capacity using a test device with a limited storage space. Further, in a case where a test device does not have a function for comparing vector address information with an address of defective data, it is impossible to repair defective cells of a semiconductor memory device.

SUMMARY OF THE INVENTION

Exemplary embodiments of the present invention are directed to a semiconductor memory device that comprises an array having memory cells arranged in rows and columns; a clock-to-address converter for counting an external clock signal to generate an address for accessing the array based on the counted value, during a test operation mode; and a redundancy circuit for storing the address generated by the clock-to-address converter.

Exemplary embodiments of the present invention provide a test system that comprises a semiconductor memory device including a clock-to-address converter for counting a clock signal and generating the counted value as an address; and a test device for generating the clock signal using addresses for defective cells of the semiconductor memory device.

Exemplary embodiments of the present invention provide a method of repairing defective cells of a semiconductor memory device that comprises counting a clock signal provided from the exterior; generating an address based on the counted value; and storing the address in a redundancy circuit as a repair address for repairing the defective cells.

Exemplary embodiments of the present inventions provide a method of repairing detective cells of a semiconductor memory device that comprises detecting defective cells from the semiconductor memory device; generating a clock signal according to an address corresponding to the detected defective cells; and counting the clock signal to store the counted value in a redundancy circuit as a repair address.

BRIEF DESCRIPTION OF THE DRAWINGS

Exemplary embodiments of the present invention will be understood in more detail from the following descriptions taken in conjunction with the accompanying drawings in which.

DETAILED DESCRIPTION OF EXEMPLARY EMBODIMENTS

Figure 1:
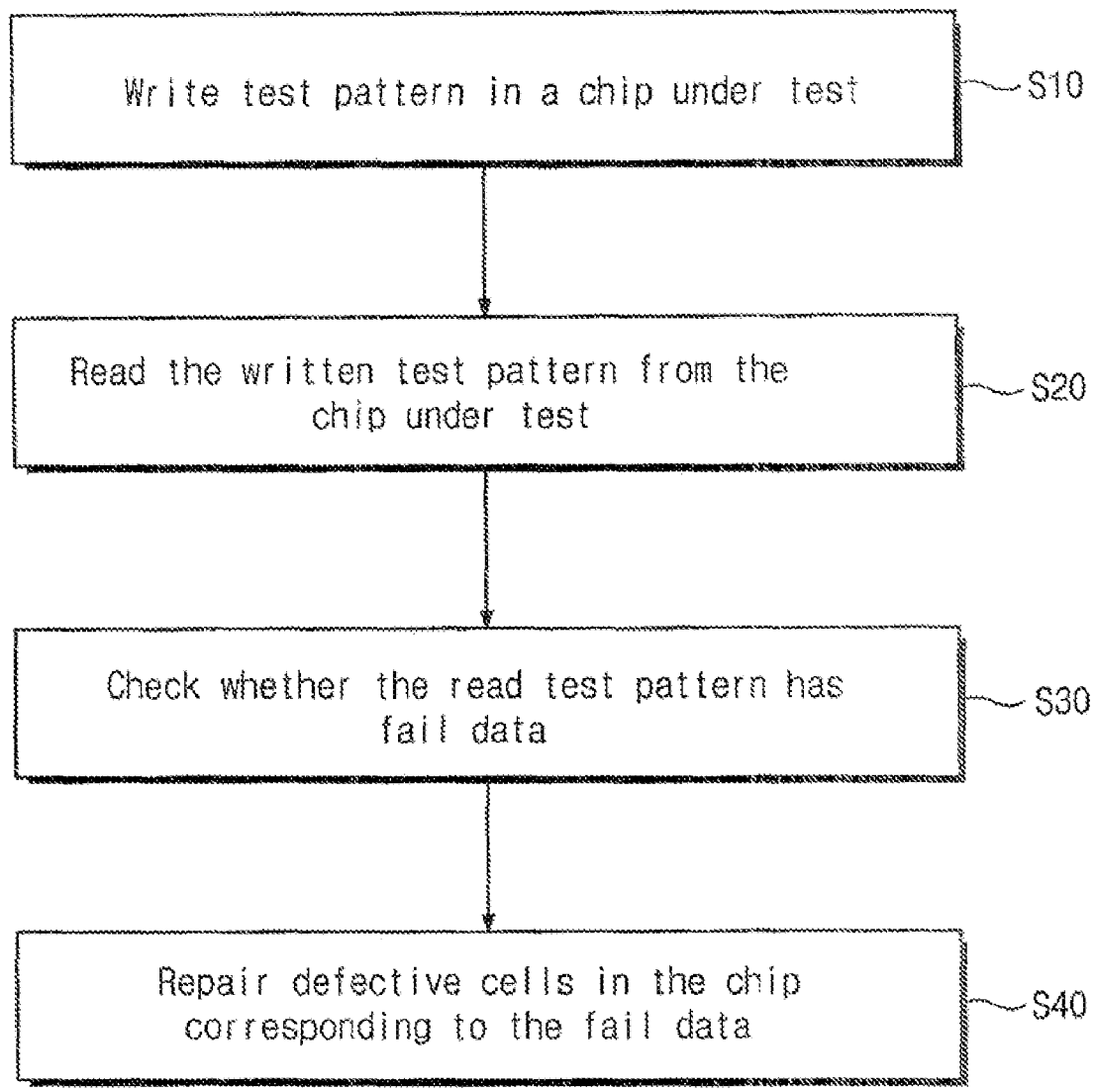
FIG. 1 is a flowchart for describing a conventional test method.

Exemplary embodiments of the present invention will now be described more fully hereinafter with reference to the accompanying drawings. This invention, however, may be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, like numbers refer to like elements throughout.

Figure 2:
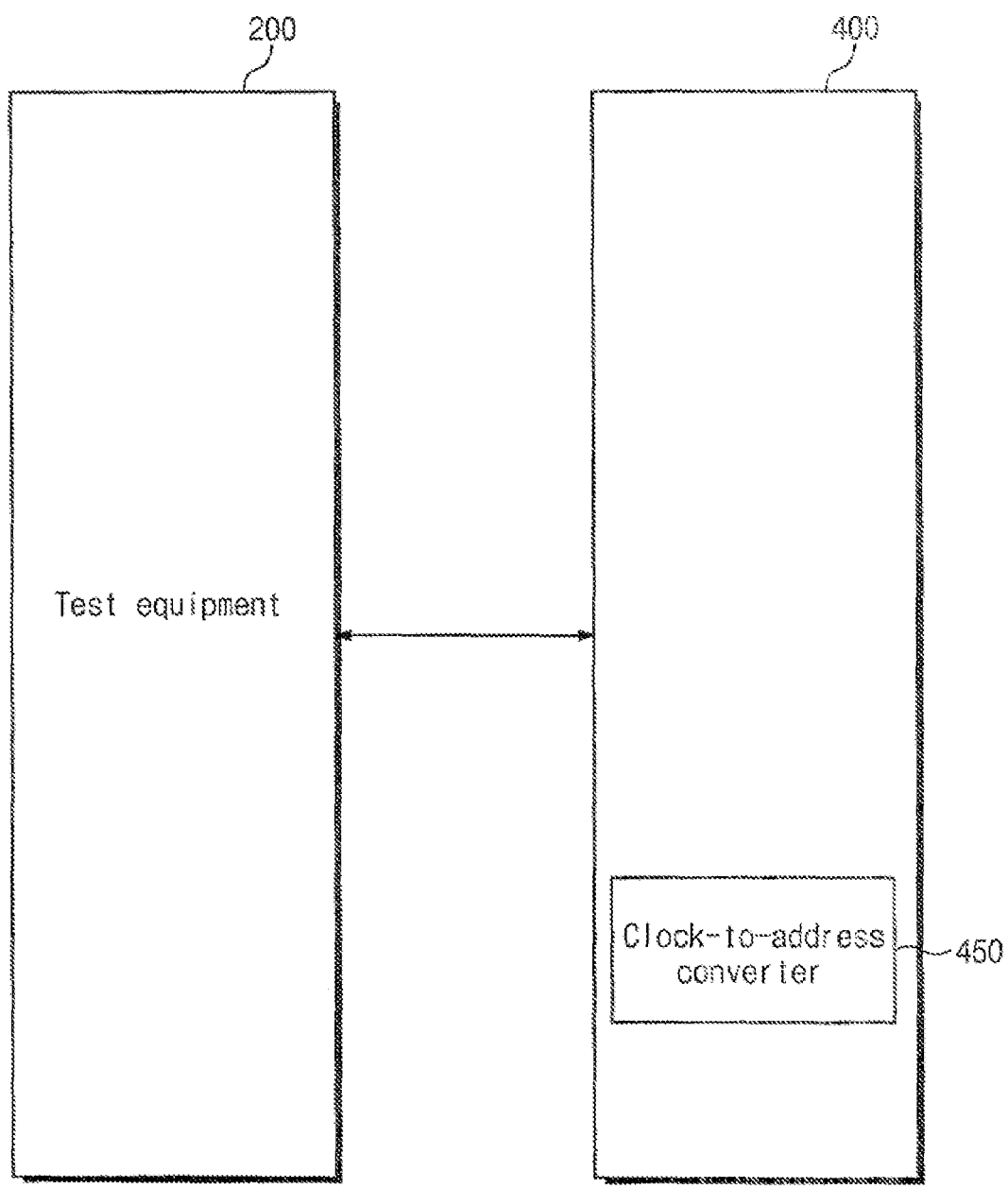
FIG. 2 is a block diagram showing a test system according to an exemplary embodiment of the present invention.

FIG. 2 is a block diagram showing a test system according to an exemplary embodiment of the present invention. The test system includes a test device 200 and a semiconductor integrated circuit device 400. The semiconductor integrated circuit device 400 may include a semiconductor memory device such as SRAM, DRAM, FRAM, PRAM, MRAM, a flash memory device, and the like.

At a test operation where it is judged whether the semiconductor memory device 400 has defective cells, the test device 200 stores test pattern data in the semiconductor memory device 400. Then, the test device 200 reads out test pattern data that is written in the semiconductor memory device 400. The test device 200 judges whether the read test pattern data includes defective data. If defective data exists, the test device 200 stores address information of the defective data in its storage space. When all the test pattern data is read out from the semiconductor memory device 400, the test device 200 performs a repair operation according to the presence of defective data. If defective data exists, the test device 200 converts address information of defective data, which is stored in the storage space, into a clock signal. The test device 200 transfers the address information to the semiconductor memory device 400 over a clock path. For example, the test device 200 makes the clock signal be toggled by a value of a repair address. The semiconductor memory device 400 includes a clock-to-address converter 450, which counts a clock signal from the test device to generate the counted value as a repair address at a test operation mode. As will be described below, the converted address may be stored in a redundancy circuit that includes electric fuses.

As understood from the above description, the test device 200 can generate a clock signal as a repair address using address information with respect to defective data without additional vector address information. This means that the test device 200 does not need a space for storing vector address information. Further, the test device 200 does not need a function of comparing vector address information with an address of defective data. With exemplary embodiments of the present invention, a repair address is provided to the semiconductor memory device 400 via a clock line, not via an address bus. The semiconductor memory 400 converts an input clock signal into a repair address, which is stored in a redundancy circuit of the semiconductor memory device 400.

Figure 3:
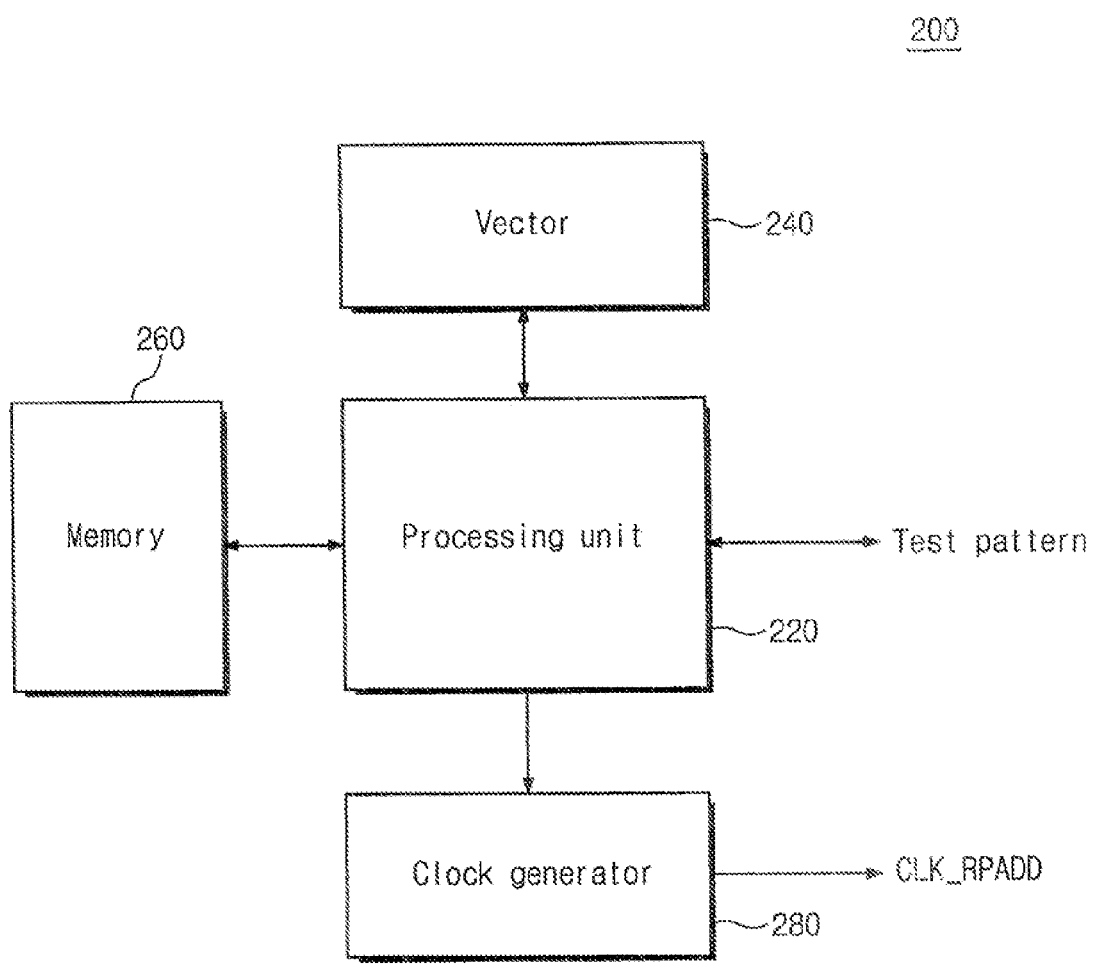
FIG. 3 is a block diagram showing a semiconductor memory device illustrated in FIG. 2.

FIG. 3 is a block diagram showing the test device illustrated in FIG. 2 in more detail.

Referring to FIG. 3, the test device 200 comprises a processing unit 220, a vector storing part 240, a memory 260, and a clock generator 280. The processing unit 220 is configured to control an overall test operation based on a given test sequence. The vector storing part 240 stores various types of test pattern data that are to be written in a semiconductor memory device under test. For example, in the case of writing test pattern data in a semiconductor memory device 400, the processing unit 220 may transfer the test pattern data stored in the vector storing part 240 to the semiconductor memory device 400 according to a given timing of a test sequence. The processing unit 220 reads the test pattern data stored in the semiconductor memory device 400 and detects/judges whether the read test pattern data coincides with the written test pattern data. If un-coinciding data, that is, defective data, is detected, the address information of the detected defective data and information, for example, a test pattern data type, a memory device number at a wafer level, and the like, related to the defective data are stored in the memory 260. At a repair step, the processing unit 220 controls the clock generator 280 based on address information stored in the memory 260, and the clock generator 280 generates a clock signal CLK_RPADD during predetermined cycles according to a control of the processing unit 220. The clock signal CLK_RPADD thus generated is transferred to the semiconductor memory device 400 as a repair address.

The test device 200 according to an exemplary embodiment of the present invention does not include the above-described vector address information. On the other hand, the present test device 200 only has a storage space sufficient for storing test pattern data and defect information. Accordingly, it is possible to repair defective cells of the semiconductor memory device 400 using the test device 200 that does not include a function for comparing vector address information with defect information and a space for storing vector address information, which will be more fully described below.

Figure 4:
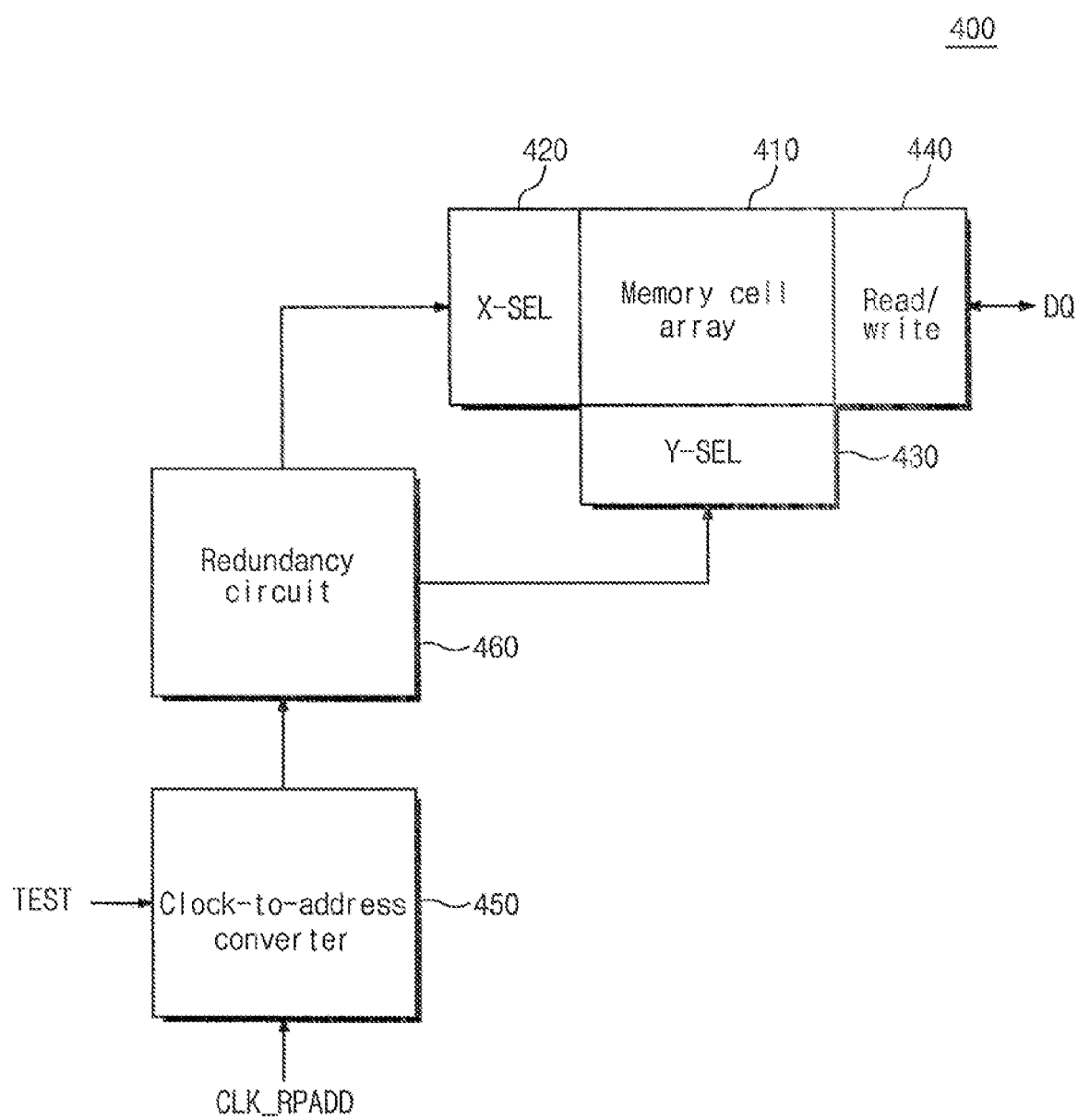
FIG. 4 is a block diagram showing a test device illustrated in FIG. 2.

FIG. 4 is a block diagram showing the semiconductor memory device illustrated in FIG. 2 in more detail.

Referring to FIG. 4, the semiconductor memory device 400 comprises a memory cell array 410, a row selector circuit 420 identified by "X-SEL", a column selector circuit 430 identified by "Y-SEL", a read/write circuit 440, a clock-to-address converter 450, and a redundancy circuit 460.

The memory cell array 410 includes memory cells (not shown) arranged in rows and columns in the following, the rows and columns of the memory cell array 410 are referred to as main rows and main columns, respectively. Although not shown in the drawings, the memory cell array 410 may include rows of redundant cells and/or columns of redundant cells so as to repair defective rows and/or defective columns. The rows of redundant cells are referred to as redundant rows, and the columns of redundant cells are referred to as redundant columns. The row selector circuit 420 selects main rows or redundant rows of the memory cell array 410 in response to a row address, and the column selector circuit 430 selects main columns or redundant columns of the memory cell array 410 in response to a column address. The read/write circuit 440 writes or reads data in or from the memory cell array 410.

The clock-to-address converter 450 operates in response to a control signal TEST indicating a test operation mode, more specifically, a repair period of a test operation mode, and converts the input clock signal CLK_RPADD into an address. The clock signal CLK_RPADD may be supplied from the test device 200 during the test operation mode. The control signal TEST may be supplied from the test device 200 or from control logic (not shown) for controlling an overall operation of the memory device 400. The clock-to-address converter 450 counts the clock signal CLK_RPADD and generates a repair address using the counted value. The clock-to-address converter 450 may be configured to operate when the control signal TEST indicates the test operation mode. A repair address generated by the clock-to-address converter 450 is provided to the redundancy circuit 460. The redundancy circuit 460 includes well-known electric fuses, which are used to store repair addresses. The redundancy circuit 460 may control the row and column selector circuits 420 and 430 according to an address input at a normal operation mode. For example, if an address input at the normal operation mode corresponds to a repair address stored in the redundancy circuit 460, the redundancy circuit 460 controls the row/ column selector circuit 420/430 so that a redundant row/column is selected instead of a main row/column corresponding to an input address.

A test system according to an exemplary embodiment of the present invention can perform a repair operation in a die/chip unit at a wafer level. For example, a repair operation for one semiconductor memory device can be performed after writing and reading test pattern data in and from the semiconductor memory device. These steps may be repeated with respect to semiconductor memory devices, that is, chips on a wafer, which will be more fully described in the following.

When a test device 200 enters a test operation mode, it selects one of many types of test pattern data stored part 240 and stores the selected test pattern data in a semiconductor memory device 400. And then, the test device 200 reads the test pattern data from the semiconductor memory device 400 according to a given timing. The processing unit 220 in the test device 200 detects defective data by comparing read test pattern with written test pattern data. If defective data is detected, address information of the defective data is stored in the memory 260 under the control of the processing unit 260. The above operations may be repeated until all data stored in the semiconductor memory device 400 has been read out. Once the read operations are completed, the test device 200 controls a clock generator 280 according to an address of the defective data that is stored in the memory 260. For example, the test device 200 controls the clock generator 280 so that a clock signal CLK_RPADD is generated during predetermined cycles based on the address of defective data. The clock signal CLK_RPADD thus generated is transferred to the clock-to-address converter 450 of the semiconductor memory device 400 shown in FIG. 4 over a clock path. The clock-to-address converter 450 counts the input clock signal CLK_RPADD and outputs the counted value to the redundancy circuit 460 as a repair address. The repair address may be stored in the redundancy circuit 460 according to a well-known manner.

As understood from the above description, the test device 200 includes a storage space, that is, a memory 260, for storing test pattern data and defect information, while it does not need a storage space for storing vector address information. Accordingly, it is possible to repair defective cells of the semiconductor memory device 400 using the test device 200 that does not includes a function for comparing vector address information with defect information and a space for storing vector address information.

Unlike what is set forth in the above description, the test system according to an exemplary embodiment of the present invention can perform a repair operation in a wafer unit. For example, repair operations for respective semiconductor memory devices on a wafer are performed sequentially after sequentially writing and reading test pattern data in and from respective semiconductor memory devices. The read, write and repair operations are identical to those described above, and description thereof is thus omitted.

Figure 5:
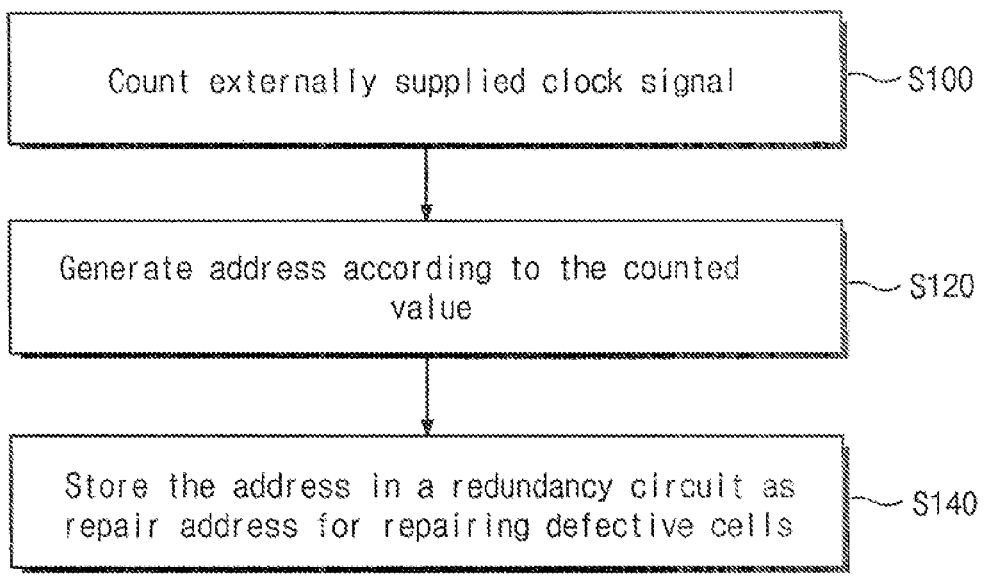
FIG. 5 is a flowchart for describing a repair method for a semiconductor memory device illustrated in FIG. 2.

FIG. 5 is a flowchart for describing a repair method of a semiconductor memory device using the system shown in FIG. 2.

Referring to FIG. 5, a method for repairing defective cells of a semiconductor memory device comprises counting a clock signal provided from the exterior (S100); generating an address based on the counted value (S120); and storing the address in a redundancy circuit as a repair address for repairing the defective cells (S140).

Figure 6:
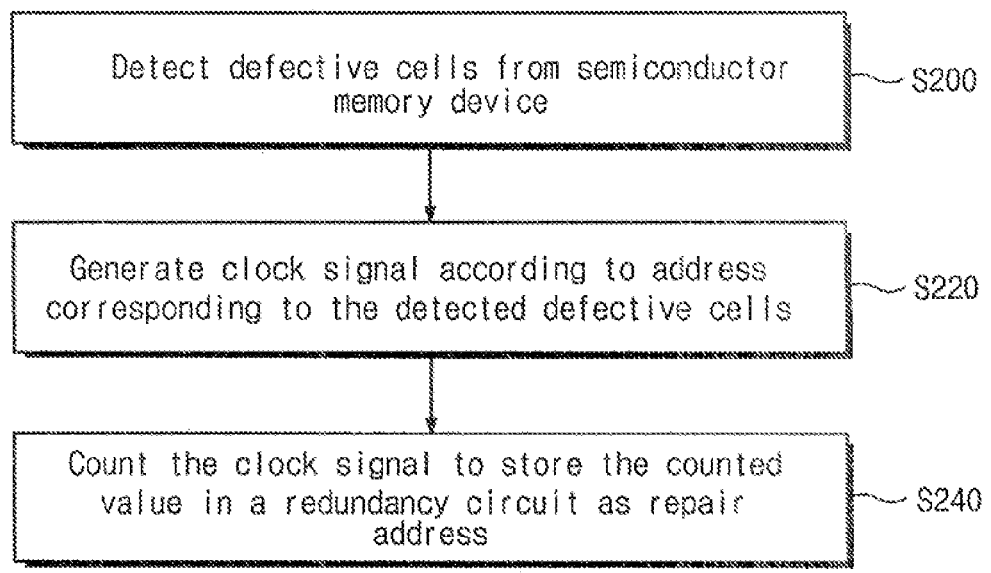
FIG. 6 is a flowchart for describing a repair method for a test system illustrated in FIG. 2.

FIG. 6 is a flowchart for describing a repair method of the test system shown in FIG. 2.

Referring to FIG. 6, a method of repairing detective cells of a semiconductor memory device comprises detecting defective cells from the semiconductor memory device (S200); generating a clock signal according to an address corresponding to the detected defective cells (S220); and counting the clock signal to store the counted value in a redundancy circuit as a repair address (S240).

Although the present invention has been described in connection with the exemplary embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor memory device comprising:
an array having memory cells arranged in rows and columns;
a clock-to-address converter for counting an external clock signal containing repair address information and converting the counted clock signal to an address for accessing the array based on the counted value, wherein the external clock is supplied from a test device during a test operation mode; and
a redundancy circuit for permanently storing the address generated by the clock-to-address converter and for providing the stored address to the array.

2. The semiconductor memory device of claim 1, wherein the address generated by the clock-to-address converter is a repair address indicating defective cells of the memory cells.

3. The semiconductor memory device of claim 2, wherein the redundancy circuit comprises electrical fuses that are cut for permanently storing the repair address.

4. The semiconductor memory device of claim 3, wherein the electrical fuses are cut selectively according to the repair address.

5. The semiconductor memory device of claim 1, wherein the semiconductor memory device comprises a flash memory device.

6. The semiconductor memory device of claim 1, further comprising:
a row selector circuit for selecting rows of the array based on a row address;
a column selector circuit for selecting columns of the array based on a column address; and
a read/write circuit for reading out data from the array and writing data in the array.

7. The semiconductor memory device of claim 6, wherein the rows comprises main rows and redundant rows, and
the row selector circuit operates to selectively activate the redundant rows according to addresses stored in the redundancy circuit at a normal operation mode.

8. The semiconductor memory device of claim 6, wherein the columns comprise main columns and redundant columns, and
the column selector circuit operates to selectively activate the redundant columns according to columns stored in the redundancy circuit at a normal operation mode.

9. A semiconductor memory device comprising:
an array having memory cells arranged in rows and columns;
a row selector circuit for selecting rows of the array in response to a row address;
a column selector circuit for selecting columns of the array in response to a column address;
a read/write circuit for reading and writing data from and to the array;

a clock-to-address converter for converting an external clock signal containing repair address information into an address indicating defective cells of the memory cells during a test operation mode; and a redundancy circuit having electric fuses and configured to permanently store the address generated by the clock-to-address converter and for providing the stored address to the array.

10. The semiconductor memory device of claim 9, wherein the rows comprise main rows and redundant rows, and the row selector circuit selectively activates the redundant rows based on an address stored in the redundancy circuit at a normal operation mode.

11. The semiconductor memory device of claim 9, wherein the columns comprise main columns and redundant columns, and the column selector circuit selectively activates the redundant columns based on an address stored in the redundancy circuit at a normal operation mode.

12. A method of repairing defective cells of a semiconductor memory device comprising:

counting an externally provided clock signal containing repair address information;

generating a defect address based on a counted value; and storing the defect address permanently in a redundancy circuit as a repair address for repairing defective cells of the semiconductor memory.

13. The method of claim 12, wherein the clock signal is provided from a test device.

14. The method of claim 12, wherein the redundancy circuit comprises electric fuses that are selectively cut according to the defect address to form the repair address.

15. The method of claim 12, wherein the clock signal is generated by the test device according to an address corresponding the detective cells.

16. The method of claim 15, wherein the test device comprises a storage space for temporarily storing the address corresponding to the detective cells.

17. The method of repairing detective cells of a semiconductor memory device, comprising:

detecting defective cells of the semiconductor memory device;

generating a clock signal according to an address corresponding to the detected defective cells; and counting the clock signal to store the counted value permanently in a redundancy circuit as a repair address for use in accessing the semiconductor memory device.

* * * * *